United States Patent
Kim et al.

(10) Patent No.: US 7,566,927 B2
(45) Date of Patent: Jul. 28, 2009

(54) FLASH MEMORY DEVICE

(75) Inventors: Moo-Sung Kim, Yongin-si (KR);
Yeong-Taek Lee, Seoul (KR);
Seung-Jae Lee, Seoul (KR)

(73) Assignee: Samsung Electronics Co., Ltd.,
Gyeonggi-do (KR)

( * ) Notice: Subject to any disclaimer, the term of this patent is extended or adjusted under 35 U.S.C. 154(b) by 0 days.

(21) Appl. No.: 10/840,580

(22) Filed: May 7, 2004

(65) Prior Publication Data

US 2005/0006692 A1    Jan. 13, 2005

(30) Foreign Application Priority Data

Jul. 10, 2003    (KR) .................. 10-2003-0046877

(51) Int. Cl.
*H01L 29/788*    (2006.01)
(52) U.S. Cl. .................. 257/314; 257/315; 257/321; 365/185.24; 365/185.26
(58) Field of Classification Search .................. 257/314, 257/316, 315; 365/185.33, 185.28, 226, 365/26, 28, 185
See application file for complete search history.

(56) References Cited

U.S. PATENT DOCUMENTS

| 5,798,966 | A | 8/1998 | Keeney |
| 5,812,457 | A * | 9/1998 | Arase .................. 365/185.22 |
| 6,456,557 | B1 * | 9/2002 | Dadashev et al. .......... 365/226 |
| 6,977,850 | B2 * | 12/2005 | Tanzawa ................ 365/189.11 |

OTHER PUBLICATIONS

English Translation of Korean Office Action dated Jul. 20, 2006.

\* cited by examiner

*Primary Examiner*—Thinh T Nguyen
(74) *Attorney, Agent, or Firm*—Harness, Dickey & Pierce, P.L.C.

(57)    ABSTRACT

A flash memory device may include a memory cell array having a plurality of word lines, bit lines, and memory cells. Each memory cell may be arranged at an intersection of a corresponding word line and a corresponding bit line. The device may include a bit line voltage setting circuit for setting a voltage on a bit line of a given memory cell to be programmed to a variable bit line voltage or to a ground voltage. A variable bit line voltage generating circuit may be provided in the flash memory device for generating the variable bit line voltage. To facilitating programming of the device, a bit line voltage of a given memory cell to be programmed may be set based on a supply voltage of the device, so as to maintain a voltage difference based on the set bit line voltage above a given threshold voltage.

13 Claims, 6 Drawing Sheets

FLASH MEMORY DEVICE

CROSS REFERENCE TO RELATED APPLICATION

This application claims the priority of Korean Patent Application No. 2003-46877, filed on Jul. 10, 2003, in the Korean Intellectual Property Office, the disclosure of which is hereby incorporated by reference in its entirety.

BACKGROUND OF THE INVENTION

1. Field of the Invention

The present invention relates to a flash memory device, voltage generating circuit of the flash memory device, and a method for facilitating programming of the flash memory device.

2. Description of the Related Art

A flash memory device is a particular type of non-volatile electrically erasable programmable read-only memory (EEPROM) device which does not require a refresh function. The flash memory device may be classified into a NOR type and a NAND type. The NOR type is primarily used to store a small amount of information at high speeds, while the NAND type is mainly used to store a larger amount of information.

Figure 1:
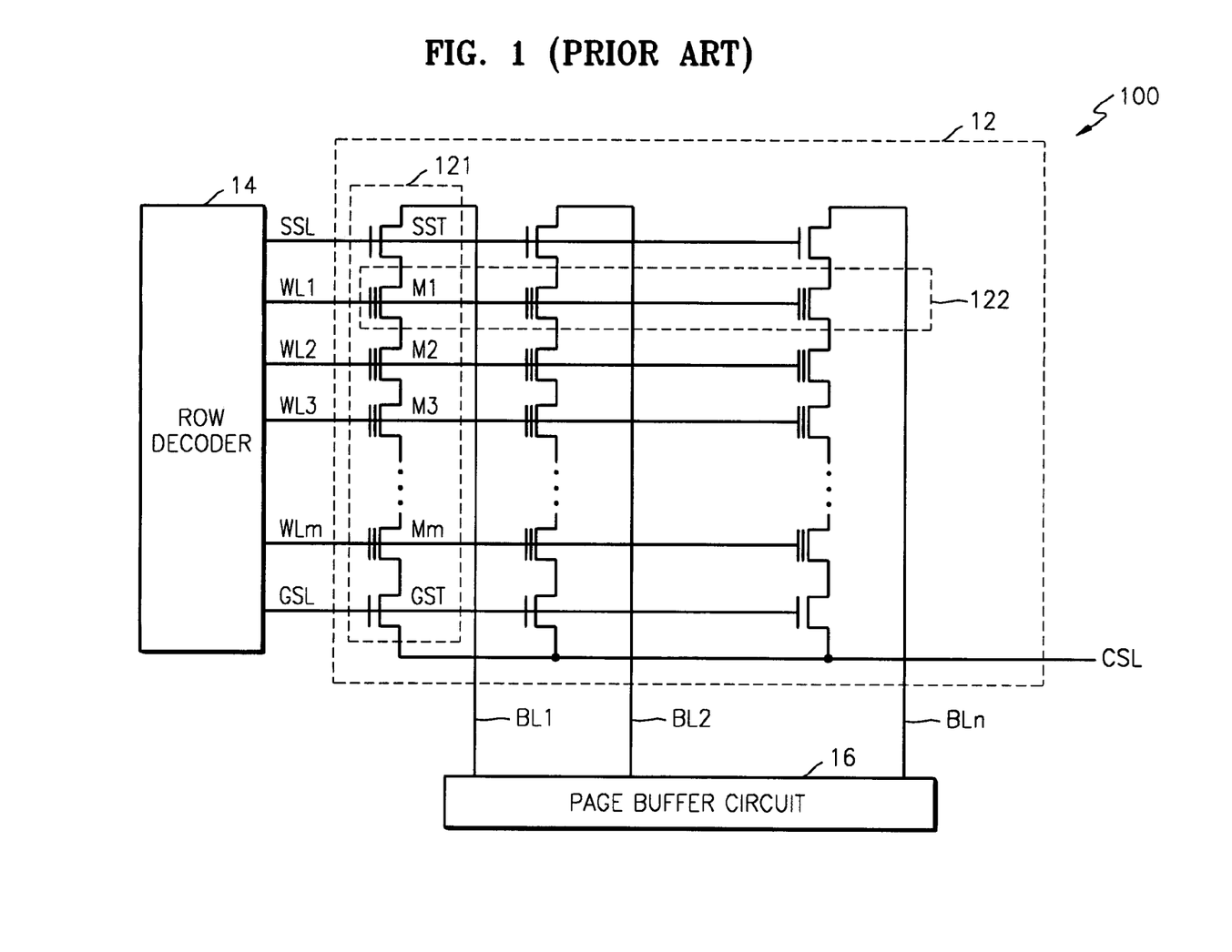
FIG. 1 is a block diagram illustrating a prior art NAND-type flash memory device.

FIG. 1 is a block diagram illustrating a prior art NAND-type flash memory device. Referring to FIG. 1, a typical NAND-type flash memory device 100 includes a memory cell array 12, a row decoder 14 and a page buffer circuit 16. The memory cell array 12 includes a plurality of cell strings. A given cell string 121 includes a string selection transistor (SST) connected to a bit-line BL1, a ground selection transistor (GST) connected to a common source line (CSL), and a plurality of memory cells M1-Mm. The plurality of memory cells M1-Mm are serially connected between the SST and the GST. A gate of the SST is connected to a string selection line (SSL), and a gate of the GST is connected to a ground selection line (GSL).

The plurality of memory cells M1-Mm are transistors, each of which has a floating gate and a control gate. The control gates of memory cells M1-Mm in each row are connected to a corresponding word line of a plurality of word lines WL1-WLm output from the row decoder 14. A row of memory cells connected to a single word line is referred to as a page. For example, a row of memory cells M1 connected to the word line WL1 corresponds to a page 122.

A plurality of bit lines BL1-BLn is connected to the page buffer circuit 16. The page buffer circuit 16 is a register circuit used to read/store a large amount of data within a short period of time. Data input from the outside is stored in the memory cell array 12 through the page buffer circuit 16, and data output from the memory cell array 12 is output to the outside through the page buffer circuit 16.

Respective memory cells M1-Mm are programmed by applying a high program voltage to the control gates of the memory cells M1-Mm, setting a predetermined voltage on the BL1, and controlling threshold voltages of cell transistors. To program the memory cells M1-Mm, a corresponding SST must be turned on. Thus, a voltage on the bit line BL1 must be less than a voltage (Vssl–Vth_sst) obtained by subtracting a threshold voltage (Vth_sst) of the SST from a voltage (Vssl) on the SSL.

On the other hand, the SST must be turned off to prevent the memory cells M1-Mm from being programmed. Therefore, the voltage on the bit line BL1 must be greater than the voltage (Vssl–Vth_sst) obtained by subtracting a threshold voltage (Vth_sst) of the SST from a voltage (Vssl) on the SSL. In programming of the memory cells M1-Mm, the voltage Vssl on the SSL is typically set to a supply voltage Vcc, and the voltage on the BL1 is typically set to a ground voltage or a specific voltage higher than the ground voltage.

Figure 2:
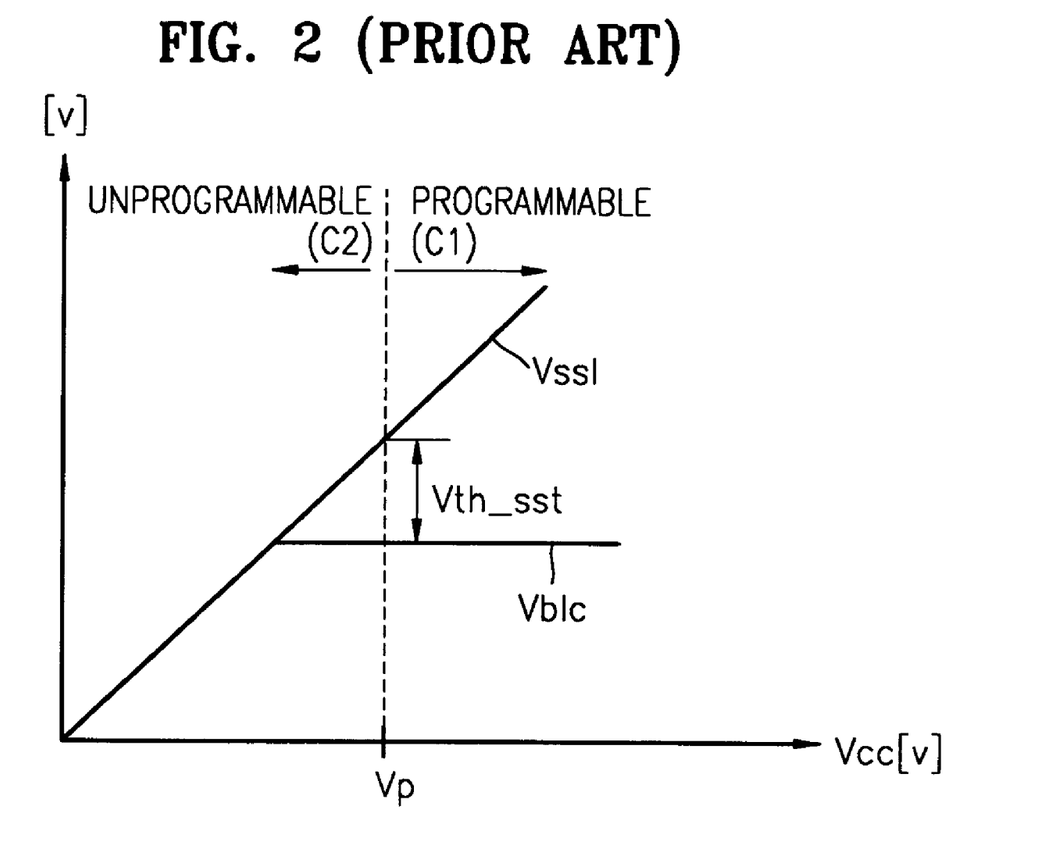
FIG. 2 illustrates a graph showing the relationship among a voltage on a bit line, a voltage on a string selection line, and a supply voltage in programming of the prior art NAND-type flash memory device of FIG. 1.

FIG. 2 illustrates a graph showing the relationship among the voltage Vblc on the BL1, the voltage Vssl on the SSL, and the supply voltage Vcc in programming of the prior art NAND-type flash memory device 100. Referring to FIG. 2, the voltage Vssl on the SSL is proportional to Vcc. The voltage on BL1 has a specific voltage level of Vblc.

However, the level of Vcc may be changed due to noise or other factors. If the level of Vcc is changed, the level of the voltage Vssl on the SSL is also changed. If the Vssl on the SSL decreases due to the decrease in Vcc, while the voltage on the BL1 is fixed to the specific level of Vblc, the SST does not turned on. In this case, the memory cells in the prior art NAND-type flash memory device 100 cannot be programmed.

In FIG. 2, C1 represents a case where the difference between the voltage Vssl on the SSL and the voltage Vblc on the BL1 is greater than the threshold voltage Vth_sst. In such a case it is possible to program the memory cells. C2 represents a case where the difference between the voltage Vssl on the SSL and the voltage Vblc is less than the threshold voltage Vth_sst of the SST. In this case, it is not possible to program the memory cells. In other words, if Vcc is less than a given voltage Vp (as shown by the dotted line in FIG. 2), it is not possible to program the memory cells. Accordingly, a programming error may occur when memory cells that are to be programmed cannot be programmed.

SUMMARY OF THE INVENTION

An exemplary embodiment of the present invention is directed to a flash memory device, which may include a memory cell array having a plurality of word lines, bit lines, and memory cells. Each memory cell may be arranged at an intersection of a corresponding word line and a corresponding bit line. The flash memory device may also include a bit line voltage setting circuit for setting a voltage on a bit line of a given memory cell to be programmed to a variable bit line voltage or to a ground voltage. A variable bit line voltage generating circuit may be provided in the flash memory device for generating the variable bit line voltage.

Another exemplary embodiment of the present invention is directed to a flash memory device having a bit line, a string selection transistor connected to the bit line and turned on in response to a voltage on a string selection line, and a ground selection transistor connected to a common source line and turned on in response to a voltage on a ground selection line. A plurality of memory cell transistors may be serially connected between the string selection transistor and ground selection transistor, and connected to the bit line through the string selection transistor. The flash memory device may also include a bit line voltage setting circuit for setting a voltage on the bit line to one of a variable bit line voltage, ground voltage and supply voltage, and a variable bit line voltage generating circuit for generating the variable bit line voltage.

Another exemplary embodiment of the present invention is directed to a semiconductor device having at least one memory cell arranged at an intersection of a corresponding word line and bit line of the device. A bit line voltage setting circuit of the device may set a bit line voltage of the memory cell to one of at least two desired voltages, and a variable bit line voltage generating circuit may generate one of the at least two desired voltages.

Another exemplary embodiment of the present invention is directed to voltage generating circuit of a flash memory device. The flash memory device includes a supply voltage and a memory cell array composed of a plurality of word lines, bit lines, and memory cells, each memory cell located at an intersection of a corresponding word line and a corresponding bit line. The voltage generating circuit may include a voltage dividing and clamping circuit. The voltage dividing and clamping circuit may be enabled in response to a given enable signal for dividing the supply voltage, generating a division voltage if the supply voltage falls within a given voltage range, generating the division voltage proportional to the supply voltage if the supply voltage exceeds a given voltage level, and suppressing an increase in the division voltage above the given voltage level. The voltage generating circuit may include a differential amplifier that generates a variable bit line voltage based on the division voltage.

Another exemplary embodiment of the present invention is directed to a method of facilitating programming in a semiconductor device. The device may have a supply voltage and a memory cell array composed of a plurality of word lines, bit lines, and memory cells, each memory cell located at an intersection of a corresponding word line and a corresponding bit line. The method includes setting a bit line voltage of a given memory cell to be programmed based on the supply voltage, so as to maintain a voltage difference based on the set bit line voltage above a given threshold voltage to enable programming of the given memory cell.

BRIEF DESCRIPTION OF THE DRAWINGS

Exemplary embodiments of the present invention will become more fully understood from the detailed description herein below and the accompanying drawings, wherein like elements are represented by like reference numerals, which are by way of illustration only and thus do not limit the exemplary embodiments of the present invention and wherein.

DETAILED DESCRIPTION OF THE EXEMPLARY EMBODIMENTS

The present invention will now be described more fully with reference to the accompanying drawings, in which exemplary embodiments of the invention are shown. In the drawings, like reference numerals may be used to refer to like elements throughout.

Figure 3:
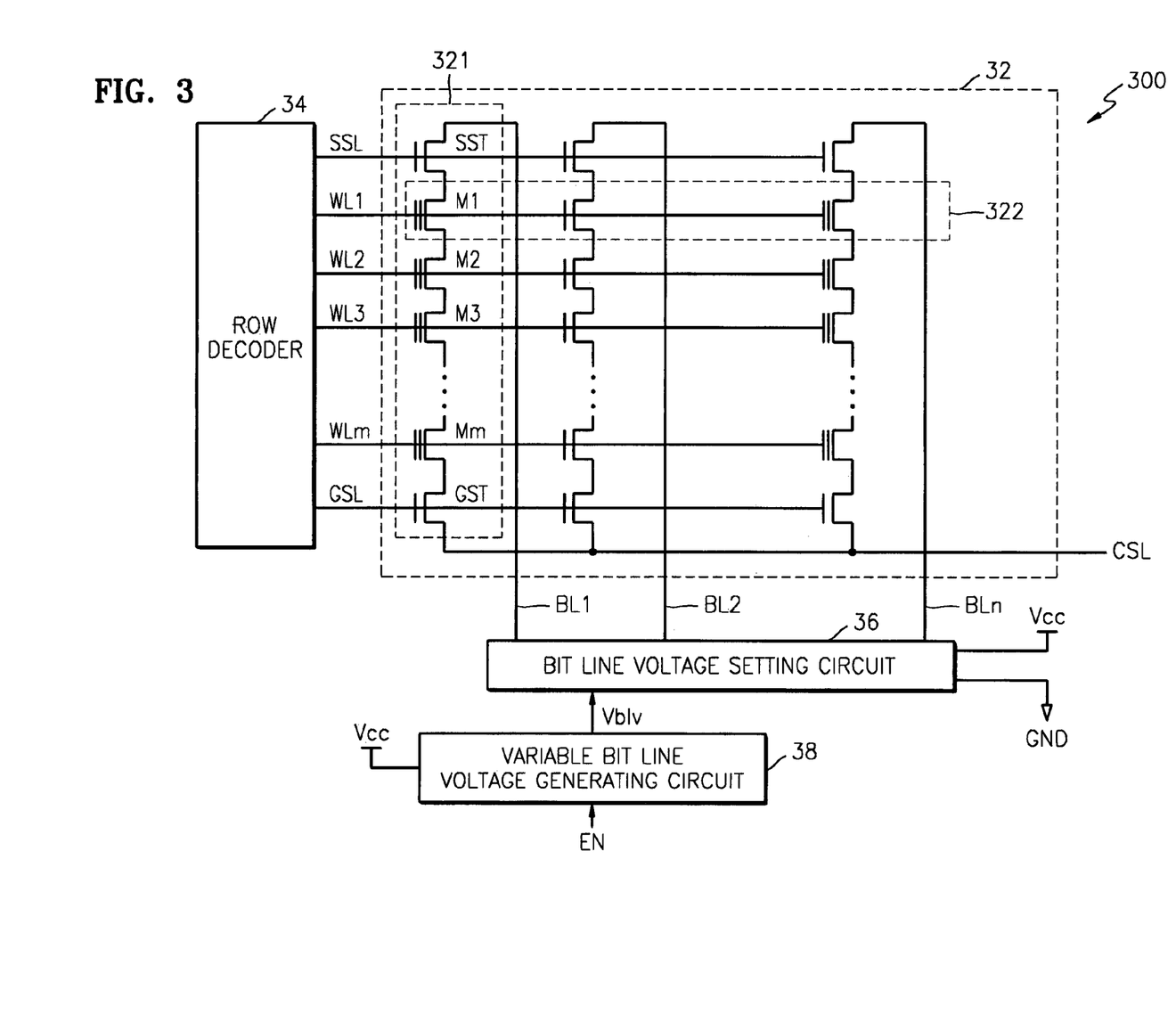
FIG. 3 is a block diagram illustrating a NAND-type flash memory device according to an exemplary embodiment of the present invention.

FIG. 3 is a block diagram illustrating a NAND-type flash memory device 300 according to an exemplary embodiment of the present invention. The NAND-type flash memory device 300 may include a memory cell array 32, a row decoder 34, a bit line voltage setting circuit 36 and a variable bit line voltage generating circuit 38. As with memory cell array 12 of FIG. 1, memory cell array 32 may include a plurality of cell strings. An exemplary cell string 321 may include a string selection transistor (SST) and a ground selection transistor (GST), for example. The SST is connected to a corresponding bit line of a plurality of bit lines BL1-BLn, and may be turned on in response to a voltage level of a string selection line (SSL). The GST is connected to a common source line (CSL) and may be turned on in response to a voltage level of a ground selection line GSL. The cell string 321 may additionally include a plurality of memory cell transistors M1-Mm serially connected between the SST and the GST. Each of the memory cell transistors M1-Mm may be connected to a corresponding bit line through the SST.

The variable bit line voltage generating circuit 38 may operate in response to an enable signal EN. In response to the EN signal, the variable bit line voltage generating circuit 38 may generate a variable bit line voltage Vblv. As will be discussed in further detail below, the variable bit line voltage Vblv may be varied or changed based on a given supply voltage Vcc that is supplied to device 300.

The bit line voltage setting circuit 36 may be adapted so as to set a given bit line voltage, such as a bit line voltage that is used for programming one or more memory cell transistors M1-Mm. The bit line voltage setting circuit 36 set the bit line voltage to one of the supply voltage Vcc, a ground voltage GND, and the variable bit line voltage Vblv.

For example, in programming of memory cells, the bit line voltage setting circuit 36 may set a voltage on a corresponding bit line to one of the GND or Vblv voltages. In order to prevent the memory cells from being programmed, the bit line voltage setting circuit 36 may set the voltage on a corresponding bit line to Vcc. For programming of the memory cells, the bit line voltage setting circuit 36 may set a voltage Vssl on a corresponding string selection line SSL to Vcc. The bit line voltage setting circuit 36 may be implemented by a register circuit. Similar to the page buffer circuit 16 of FIG. 1 that may be typically used in a NAND-type flash memory device.

Figure 4:
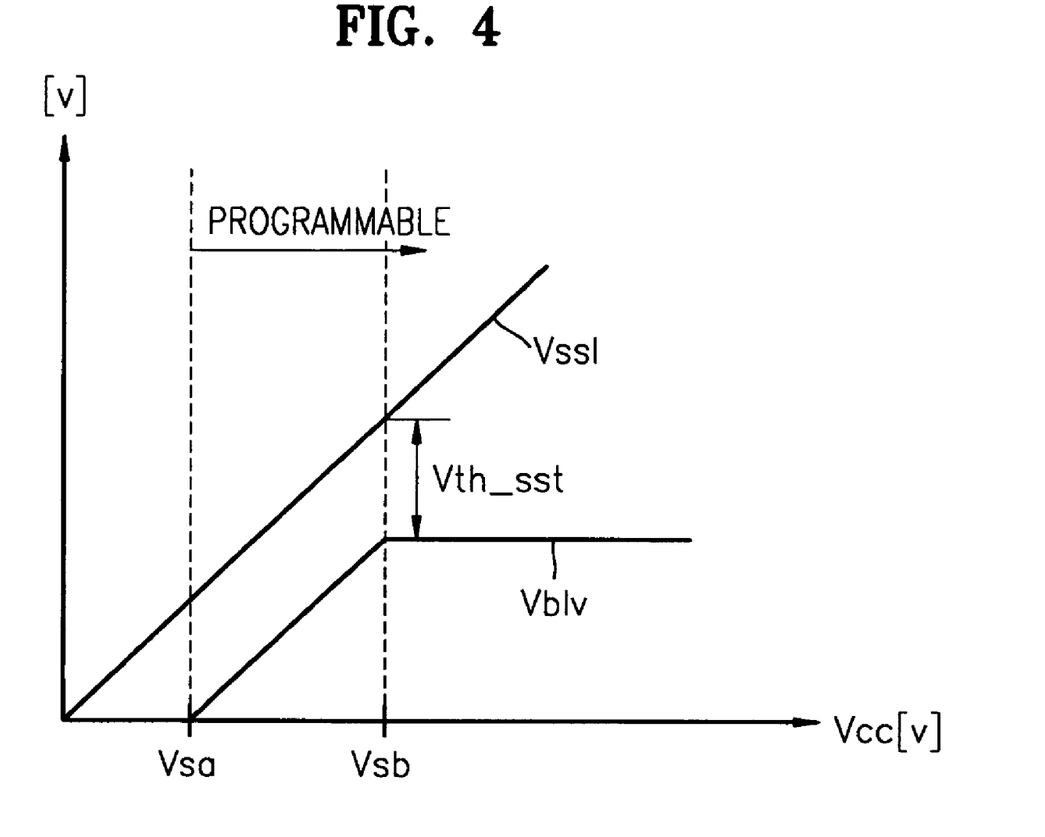
FIG. 4 illustrates a graph showing the ideal relationship between a variable bit line voltage, a voltage on a string selection line, and a supply voltage according to an exemplary embodiment of the present invention.

FIG. 4 illustrates a graph showing an ideal relationship between the variable bit line voltage Vblv, the voltage Vssl on the string selection line SSL, and the supply voltage Vcc. For programming of the memory cells, the voltage Vssl on the SSL may be set to Vcc, and thus, may be proportional to Vcc. At this time, and as shown in FIG. 4, if the variable bit line voltage Vblv is proportional to Vcc until it reaches a given voltage level Vsb, and then is maintained at the given voltage level Vsb thereafter, the difference between Vssl and Vblv may be maintained greater than the threshold voltage Vth_sst of the string selection transistor SST at all times. Therefore, if the level of Vcc should decrease for any reason (such as due to external environmental factors), causing Vssl on the string selection line SSL to also decrease, it may still be possible to program the memory cells. Accordingly, when Vcc falls within a given voltage range, i.e., Vsa-Vsb, the variable bit line voltage Vblv may be linearly proportional to Vcc. When Vcc is greater than the given level voltage Vsb, Vblv may be saturated so as to be maintained at Vsb thereafter. Thus, the difference Vssl-Vblv may remain Vth_sst at all times.

Figure 5:
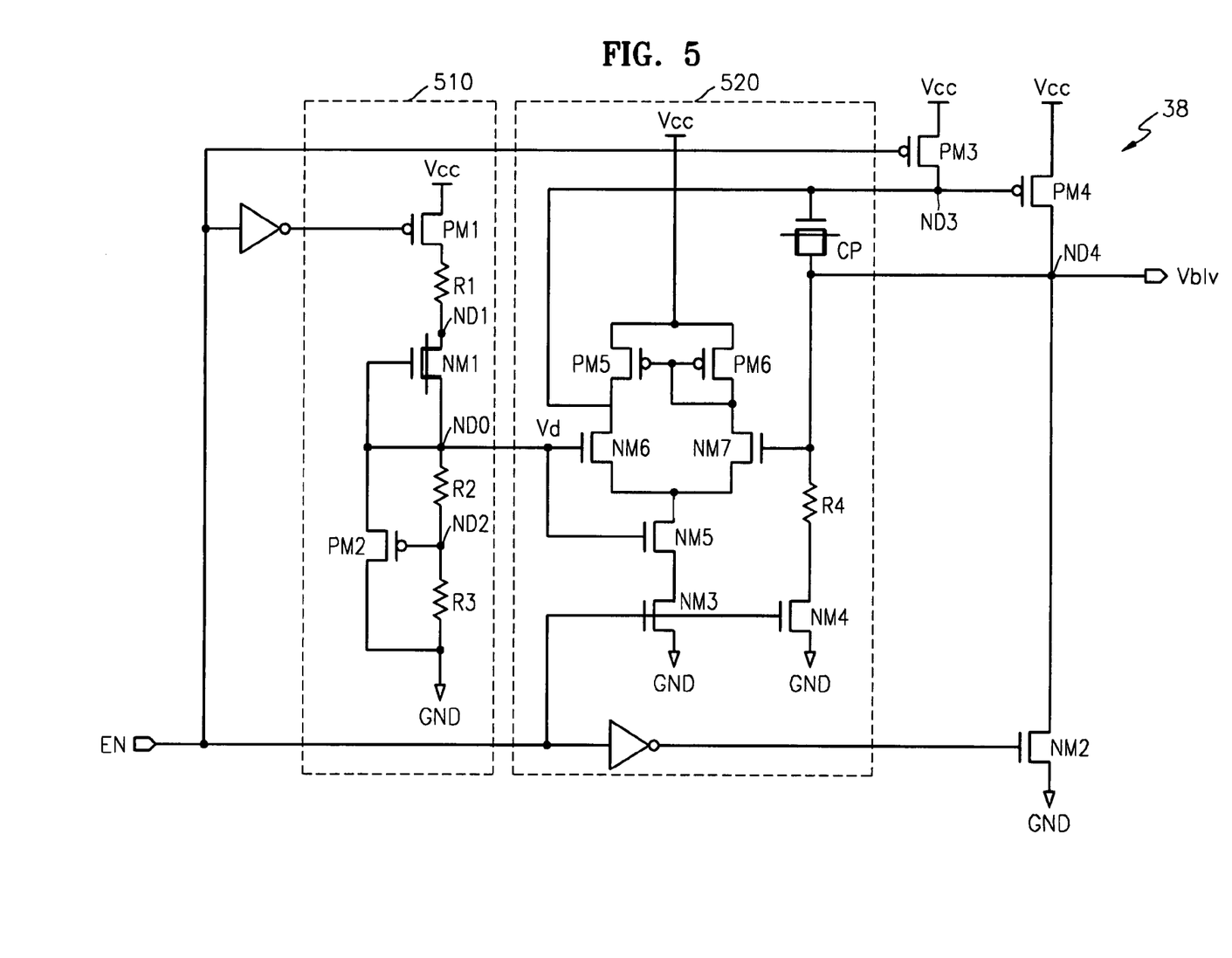
FIG. 5 is a circuit diagram of a variable bit line voltage generating circuit of FIG. 3 according to an exemplary embodiment of the present invention.

FIG. 5 is a circuit diagram of the variable bit line voltage generating circuit 38 of FIG. 3 according to an exemplary embodiment of the present invention. Referring to FIG. 5, the variable bit line voltage generating circuit 38 may include a voltage dividing and clamping circuit 510 and a differential amplifier 520.

The voltage dividing and clamping circuit 510 may include a control transistor PM1, first through third resistors R1, R2, and R3, and clamping transistors NM1 and PM2. The control transistor PM1 is connected to Vcc and may be turned on in response to the enable signal EN, thus allowing current to flow from Vcc to GND. The first resistor R1 is connected to the control transistor PM1 and to a first node ND1. The clamping transistor NM1 may be embodied as a depletion MOSFET transistor, for example. The clamping transistor NM1 may be located between the first node ND1 and a division voltage node ND0, and has a gate electrically connected to the division voltage node ND0. The second resistor R2 is connected between the division voltage node ND0 and a second node ND2. The third resistor R3 is connected between the second node ND2 and the ground voltage GND. The clamping transistor PM2 is connected between the division voltage node ND0 and GND and has a gate electrically connected to the second node ND2.

A division voltage, Vd, at the division voltage node ND0 may be given by the following expression (1):

$$Vd = \frac{R2 + R3}{R1 + R2 + R3} Vcc. \qquad (1)$$

As shown in expression (1), the division voltage Vd may be proportional to the supply voltage Vcc.

When Vcc increases above a given voltage level, the clamping transistors NM1 and PM2 suppress any further increase in a voltage level of the division voltage Vd. In other words, if the division voltage Vd increases above the given level, the clamping transistors NM1 and PM2 suppress any further increase in Vd, thereby making the level of the division voltage Vd saturated at voltages exceeding the given voltage level.

The differential amplifier 520 may include a plurality of PMOS transistors PM5, PM6, NMOS transistors NM3-NM7 and a capacitor CP. The differential amplifier 520 is adapted to receive the division voltage Vd, to output the variable bit line voltage Vblv, and to improve current driving capability of an output terminal.

Operation of the variable bit line voltage generating circuit 38 may be described in terms of activating a logic low level and a logic high level of the enable signal EN. First, a case where the enable signal EN is deactivated as a logic low level is described. In this case, the control transistor PM1 of the voltage dividing and clamping circuit 510 may be turned off. Thus, the voltage dividing and clamping circuit 510 does not operate. Also, the NMOS transistors NM3 and NM4 of the differential amplifier 520 are turned off. Since the PMOS transistor PM3 is turned on in response to the enable signal EN of a logic low level, the PMOS transistor PM4 is turned off. On the other hand, the NMOS transistor NM2 is turned on. Thus, the variable bit line voltage generating circuit 38 outputs a low voltage level at an output node ND4. Therefore, when the enable signal EN is logic low, the variable bit line voltage Vblv may have a voltage level near 0V, for example.

In the second case when the enable signal EN is activated at a logic high level, the control transistor PM1 is turned on to initiate voltage dividing and clamping circuit 510 operation.

As a result, the division voltage Vd is output in proportion to the voltage level of Vcc. Also, the NMOS transistors NM3 and NM4 of the differential amplifier 520 are turned on. The differential amplifier 520 receives the division voltage Vd and outputs the variable bit line voltage Vblv.

Figure 6:
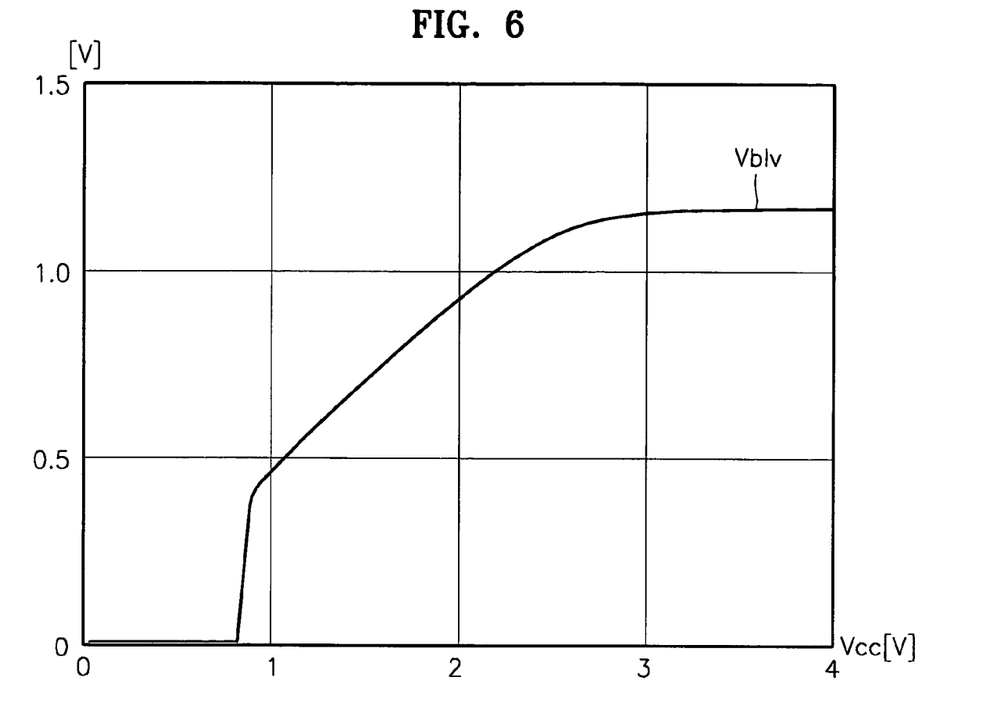
FIG. 6 illustrates a graph showing characteristics of a variable bit line voltage, obtained by simulating the variable bit line voltage generating circuit of FIG. 5 using a simulation program.

FIG. 6 illustrates a graph showing characteristics of the variable bit line voltage Vblv, obtained by simulating the variable bit line voltage generating circuit 38 of FIG. 5 using a simulation program known as HSPICE. A Simulation Program for Integrated Circuits Emphasis (SPICE) is a powerful general purpose analog circuit simulator that is used to verify circuit designs and to predict circuit behavior of integrated circuits. HSPICE is a version of the SPICE simulation software that runs on workstations and larger computers, such as on Sun/Unix platforms of ENIAC/Pender machines, for example.

FIG. 6 illustrates that it may be possible to obtain a variable bit line voltage Vblv that has characteristics similar to the ideal variable bit line voltage Vblv shown in FIG. 4.

Figure 7:
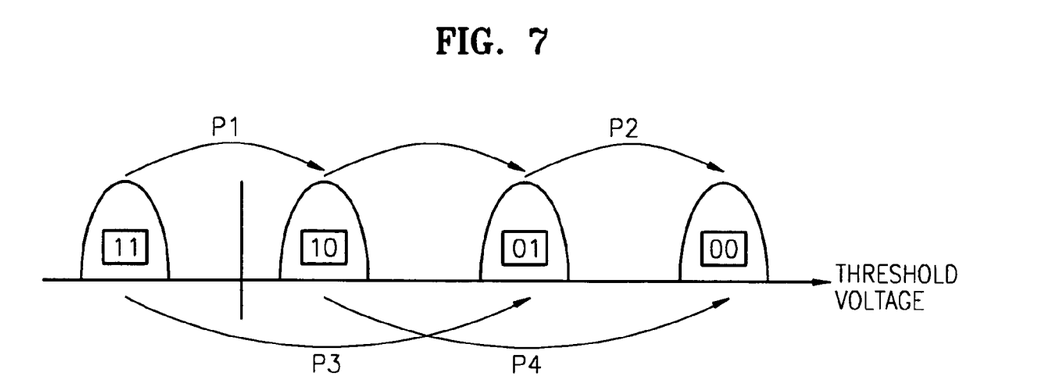
FIG. 7 is a view for explaining programming of multi-level memory cells.

FIG. 7 is a view for explaining programming of multi-level memory cells. As shown in FIG. 7, the multi-level memory cells may have one of four memory states '11', '10', '01', and '00' according to a distribution of threshold voltages of a memory cell (cell transistor). Therefore, when compared with programming of a two-level memory cell having a state of '1' or '0', programming of the multi-level memory cells is relatively complex.

Referring to FIG. 7, the state '11' may be programmed to the state '10' through programming of step P1 and can be programmed to the state '01' through programming of step P3. The state '01' can be programmed to the state '00' through programming of step P2, and the state '10' can be programmed to the state '00' through programming of step P4.

In order to program multi-level memory cells requiring these various programming steps, a bit line voltage on a given bit line for programming the memory cells may typically be fixed to one level, while setting a different program voltage on a corresponding word line. For example, by setting a program voltage on a corresponding word line in programming of step P1 to a voltage higher than that in programming of step P3, a threshold voltage of a memory cell after programming of step P3 may be higher than a threshold voltage of the memory cell after programming of step P1.

However, a flash memory device according to the exemplary embodiments of the present invention may set a voltage on a bit line in programming of memory cells to a ground voltage GND, or to the variable bit line voltage Vblv, thereby changing programming steps. For example, in programming of step P3, the voltage on the bit line may be set to GND, and in programming of step P1, the voltage on the bit line may be set to Vblv. Thus, the threshold voltage of the memory cell after programming of step P3 may be higher than the threshold voltage of the memory cell after programming of step P1. At this time, the voltage level of a program voltage applied to a corresponding word line can be changed.

The exemplary embodiments of the present invention enables a voltage on a bit line for the programming of memory cells to be set to a ground voltage or to a variable bit line voltage, in an effort to support various programming steps for multi-level memory cells. In addition, since the variable bit line voltage may be changed with respect to a supply voltage, the possibility of programming errors (i.e., where the supply voltage decreases due to external environmental factors) may be reduced, and programming of memory cells may be more accurately performed, as compared to a case where a fixed bit line voltage is used. Thus, the possibility of errors occurring due to a change in a supply voltage when programming memory cells of a semiconductor device such as a NAND-type flash memory device may be reduced.

The exemplary embodiments of the present invention being thus described, it will be obvious that the same may be varied in many ways. Such variations are not to be regarded as departure from the spirit and scope of the exemplary embodiments of the present invention, and all such modifications as would be obvious to one skilled in the art are intended to be included within the scope of the following claims.

What is claimed is:

1. A flash memory device, comprising:
   a memory cell array having a plurality of word lines, bit lines, string selection lines and cell strings, each cell string including a string selection transistor, a ground selection transistor and memory cells, all of which are connected to a corresponding bit line, each string selection line connected to corresponding string selection transistors;
   a bit line voltage setting circuit for setting a voltage on a bit line of a given memory cell to be programmed to a variable bit line voltage or a ground voltage; and
   a variable bit line voltage generating circuit for generating the variable bit line voltage,
      wherein the variable bit line voltage generating circuit increases the bit line voltage linearly proportional to the supply voltage if the supply voltage is lower than a given voltage level, and the variable bit line voltage generating circuit suppresses an increase if the supply voltage exceeds the given voltage level;
      wherein the given voltage level is lower than a difference value between a voltage of the string selection line and a threshold voltage of the string selection transistor.

2. The device of claim 1, wherein the variable bit line voltage generating circuit includes:
   a voltage dividing and clamping circuit enabled in response to a given enable signal for dividing the supply voltage, generating a division voltage if the supply voltage is lower than the given voltage level, generating the division voltage in proportion to the supply voltage if the supply voltage exceeds the given voltage level, and suppressing an increase in the division voltage above the given voltage level; and
   a differential amplifier for generating the variable bit line voltage based on the division voltage.

3. The device of claim 2, wherein the voltage dividing and clamping circuit further includes:
   a first resistor arranged between the supply voltage and a first node;
   a first transistor arranged between the first node and a division voltage node and having a gate electrically connected to the division voltage node;
   a second resistor arranged between the division voltage node and a second node;
   a third resistor arranged between the second node and the ground voltage; and
   a second transistor arranged between the division voltage node and the ground voltage and having a gate electrically connected to the second node.

4. The device of claim 1, wherein each of the plurality of memory cells has at least four memory states.

5. The device of claim 1, wherein the bit line voltage setting circuit sets voltages on one or more of the plurality of bit lines to the supply voltage.

6. A flash memory device, comprising:
   a memory cell array having a plurality of word lines, bit lines, string selection lines and cell strings, each cell string including a string selection transistor, a ground selection transistor and memory cells, all of which are connected to a corresponding bit line, each string selection line connected to corresponding string selection transistors;
   a bit line voltage setting circuit for setting a voltage on a bit line of a given memory cell to a variable bit line voltage;
   a voltage dividing and clamping circuit enabled in response to a given enable signal for dividing a supply voltage input to the flash memory device, generating a division voltage if the supply voltage is lower than given voltage level, generating the division voltage in proportion to the supply voltage if the supply voltage exceeds the given voltage level, and suppressing an increase in the division voltage above the given voltage level; and
   a differential amplifier for generating the variable bit line voltage based on the division voltage,
      wherein the given voltage is lower than a difference value between a voltage of the string selection line and a threshold voltage of the string selection transistor.

7. The device of claim 6, wherein the voltage dividing and clamping circuit further includes:
   a first resistor arranged between the supply voltage and a first node;
   a first transistor arranged between the first node and a division voltage node and having a gate electrically connected to the division voltage node;
   a second resistor arranged between the division voltage node and a second node;
   a third resistor arranged between the second node and the ground voltage; and
   a second transistor arranged between the division voltage node and the ground voltage and having a gate electrically connected to the second node.

8. The device of claim 6, wherein each of the plurality of memory cells has at least four memory states.

9. The device of claim 6, wherein the bit line voltage setting circuit sets voltages on one or more of the plurality of bit lines to the supply voltage.

10. A flash memory device, comprising:
    a memory cell array having a plurality of word lines, bit lines, string selection lines and cell strings, each cell string including a string selection transistor, a ground selection transistor and memory cells, all of which are connected to a corresponding bit line, each string selection line connected to corresponding string selection transistor, wherein each of the memory cells has at least four memory states;
    a bit line voltage setting circuit for setting a voltage on a bit line of a given memory cell to a variable bit line voltage or a ground voltage; and
    a variable bit line voltage generating circuit for generating the variable bit line voltage linearly proportional to a variable supply voltage if the variable supply voltage is lower than a given voltage level, and the variable bit line voltage generating circuit selectively suppressing an increase in the variable supply voltage if the variable supply voltage exceeds the given voltage level,
       wherein the given voltage is lower than a difference value between a voltage of the string selection line and a threshold voltage of the string selection transistor.

11. The device of claim 10, wherein the variable bit line voltage generating circuit varies or changes the bit line voltage in response to the supply voltage.

12. A flash memory device, comprising:
- a memory cell array having a plurality of word lines, bit lines, string selection lines and cell strings, each cell string including a string selection transistor, a ground selection transistor and memory cells, all of which are connected to a corresponding bit line, each string selection line connected to corresponding string selection transistors;
- a bit line voltage setting circuit for setting a voltage on a bit line of a given memory cell to be programmed to a variable bit line voltage or a ground voltage; and
- a variable bit line voltage generating circuit for generating the variable bit line voltage,
  - wherein the variable bit line voltage generating circuit selectively increases the bit line voltage linearly proportional to a received supply voltage if the supply voltage lower than a given voltage level, and the variable bit line voltage generating circuit selectively suppresses an increase if the supply voltage exceeds the given voltage level.

13. A flash memory device, comprising:
- a memory cell array having a plurality of word lines, bit lines, string selection lines and cell strings, each cell string including a string selection transistor, a ground selection transistor and memory cells, all of which are connected to a corresponding bit line, each string selection line connected to corresponding string selection transistors;
- a bit line voltage setting circuit for setting a voltage on a bit line of a given memory cell to be programmed to a variable bit line voltage or a ground voltage; and
- a variable bit line voltage generating circuit for generating the variable bit line voltage, the variable bit line voltage generating circuit being further configured to vary the variable bit line voltage based on a variation of a received supply voltage,
  - wherein the variable bit line voltage generating circuit increases the bit line voltage linearly proportional to the supply voltage if the supply voltage is lower than a given voltage level, and the variable bit line voltage generating circuit suppresses an increase if the supply voltage exceeds the given voltage level;
  - wherein the given voltage is lower than a difference value between a voltage of the string selection line and a threshold voltage of the string selection transistor.

* * * * *